(12) United States Patent
Farkas et al.

(10) Patent No.: US 11,516,905 B2
(45) Date of Patent: Nov. 29, 2022

(54) METHOD TO IMPROVE PCB TRACE CONDUCTIVITY AND SYSTEM THEREFOR

(71) Applicant: DELL PRODUCTS, LP, Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 162 days.

(21) Appl. No.: 16/847,791

(22) Filed: Apr. 14, 2020

(65) Prior Publication Data

US 2021/0321510 A1  Oct. 14, 2021

(51) Int. Cl.
*H05K 1/02* (2006.01)
*H01L 23/64* (2006.01)
*H01L 23/528* (2006.01)
*H05K 3/40* (2006.01)

(52) U.S. Cl.
CPC ......... *H05K 1/0228* (2013.01); *H01L 23/528* (2013.01); *H01L 23/64* (2013.01); *H05K 1/0245* (2013.01); *H05K 3/40* (2013.01); *H05K 2201/09227* (2013.01)

(58) Field of Classification Search
CPC ..... H01L 23/64; H01L 23/645; H01L 23/647; H01L 23/66; H01L 23/528; H05K 1/0228; H05K 1/0239; H05K 1/0242; H05K 1/0245; H05K 1/025; H05K 1/115; H05K 3/10; H05K 3/103; H05K 3/40; H05K 2201/0776; H05K 2201/09209; H05K 2201/09218; H05K 2201/0922; H05K 2201/09236; H05K 2201/09254; H05K 2201/09709; H02K 3/26; H02K 2203/03; H02K 2211/03
See application file for complete search history.

(56) References Cited

U.S. PATENT DOCUMENTS

| 5,357,050 A * | 10/1994 | Baran | H05K 1/0228 174/33 |
| 5,376,902 A * | 12/1994 | Bockelman | H01L 23/66 333/5 |
| 6,235,997 B1 * | 5/2001 | Asada | H01L 23/49838 257/691 |
| 6,909,052 B1 * | 6/2005 | Haug | H05K 1/0224 174/262 |

(Continued)

FOREIGN PATENT DOCUMENTS

CA  2697440 A1 *  4/2009  ............ H01F 5/003

*Primary Examiner* — Hoa C Nguyen
*Assistant Examiner* — John B Freal
(74) *Attorney, Agent, or Firm* — Larson Newman, LLP (57) ABSTRACT

A method may include receiving a first and a second complementary signal to provide differential signaling. The method may further include providing a first conductor trace to transport the first complementary signal; providing a second conductor trace to transport the second complementary signal, the second conductor trace immediately adjacent to the first conductor trace; providing a third conductor trace to transport the first complementary signal, the third conductor trace immediately adjacent to the second conductor trace; and providing a fourth conductor trace to transport the second complementary signal, the fourth conductor trace immediately adjacent to the third conductor trace.

20 Claims, 7 Drawing Sheets

(56) References Cited

U.S. PATENT DOCUMENTS

| | | | | |
|---|---|---|---|---|
| 7,232,959 B2* | 6/2007 | Hsu | ............... | H05K 1/0228 |
| | | | | 333/33 |
| 9,425,149 B1 | 8/2016 | Jiang et al. | | |
| 10,375,822 B2* | 8/2019 | Li | ............... | H05K 1/0245 |
| 10,736,207 B1* | 8/2020 | Bonyak | ............... | G01D 5/14 |
| 11,070,006 B2* | 7/2021 | Gailus | ............... | H05K 1/0245 |
| 2003/0095014 A1* | 5/2003 | Lao | ............... | H01L 23/49816 |
| | | | | 333/260 |
| 2010/0200276 A1* | 8/2010 | Karikalan | ............... | H05K 1/0245 |
| | | | | 174/250 |
| 2018/0177043 A1* | 6/2018 | Li | ............... | H05K 1/0245 |

* cited by examiner

METHOD TO IMPROVE PCB TRACE CONDUCTIVITY AND SYSTEM THEREFOR

FIELD OF THE DISCLOSURE

This disclosure generally relates to information handling systems, and more particularly relates to improving printed circuit board trace conductivity.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A method may include receiving a first and a second complementary signal to provide differential signaling. The method may further include providing a first conductor trace to transport the first complementary signal; providing a second conductor trace to transport the second complementary signal, the second conductor trace immediately adjacent to the first conductor trace; providing a third conductor trace to transport the first complementary signal, the third conductor trace immediately adjacent to the second conductor trace; and providing a fourth conductor trace to transport the second complementary signal, the fourth conductor trace immediately adjacent to the third conductor trace.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
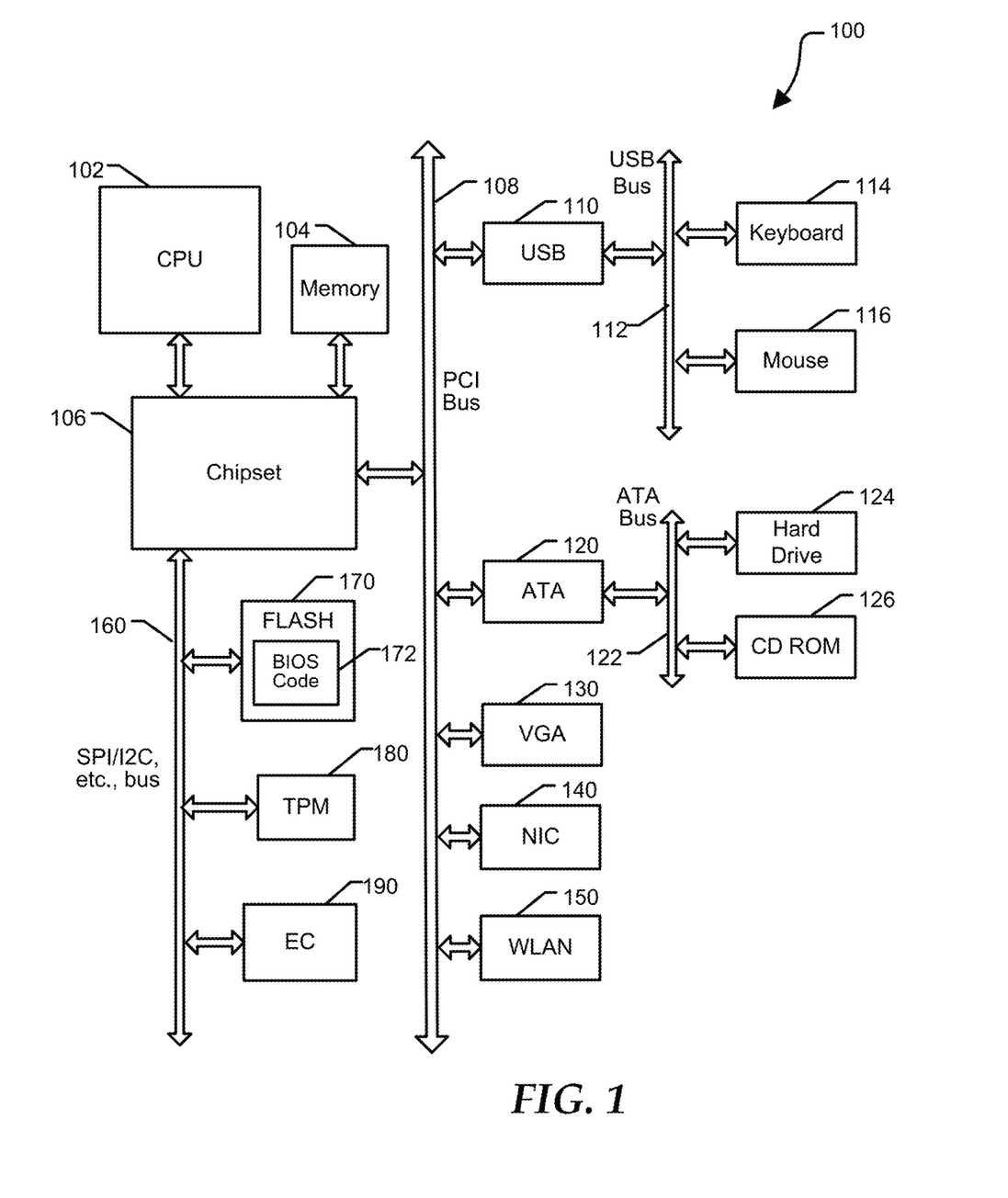
FIG. 1 is a block diagram of an information handling system according to a specific embodiment of the present disclosure.

FIG. 1 illustrates an information handling system 100 including a processor 102, a memory 104, a chipset 106, a Peripheral Component Interconnect (PCI) bus 108, a Universal Serial Bus (USB) controller 110, a USB 112, a keyboard device 114, a mouse device controller 116, an Advanced Technology Attachment (ATA) bus controller 120, an ATA bus 122, a data storage device 124, a compact disk read only memory (CD ROM) device 126, a video graphics array (VGA) device 130, a display device 131, a network interface controller (MC) 140, a wireless local area network (WLAN) controller 150, one or more serial busses 160, a non-volatile rand access memory (NVRAM) 170 for storing a basic input/output system (BIOS) 172, a Trusted Platform Module (TPM) 180, and an embedded controller (EC) 190.

NVRAM 170 can be referred to as a serial peripheral interface (SPI) flash storage device, BIOS SPI, and the like. TPM 180 is configured to ensure that the boot process starts from a trusted combination of hardware and software, and continues until the operating system has fully booted and applications are running. TPM 180 is compliant with an international standard for a secure cryptoprocessor, a dedicated microcontroller designed to secure hardware through integrated cryptographic keys. EC 190 can be referred to as a service processor, a baseboard management controller (BMC), and the like. EC 190 includes a processor that can operate out-of-band with respect to CPU 102. For example, remote management systems can utilize EC 190 to access components at information handling system independent of an operating state of CPU 102. EC 190 may be responsible for performing low level hardware tasks including thermal management and power management operations.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and one ore more components can be integrated together. For example, portions of chipset 106 can be integrated within CPU 102. In an embodiment, chipset 106 can include a platform controller hub (PCH). System 100 can include additional buses and bus protocols. Serial bus 160 is representative of one or more busses and/or bus protocols, such as a serial peripheral interface (SPI) bus, an inter-integrated circuit protocol (I2C) bus, a system management bus (SMB), a power management bus (PMBus), and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

BIOS 172 includes instructions executable by CPU 102 to initialize and test the hardware components of system 100, and to load a boot loader or an operating system (OS) from a mass storage device. BIOS 172 additionally provides an abstraction layer for the hardware, that is a consistent way for application programs and OS to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device. In an embodiment, BIOS 172 can provide one or more runtime processes or device drivers that are configured to support functionality disclosed herein. After the initialization procedure is complete and an operating system is loaded, such as Windows, computational operation of information handling system can begin. In an embodiment, the BIOS 172 can be substantially compliant with one or more revisions of the UEFI specification.

Many circuits included in an information handling system operate at very high frequencies, including memory interfaces such as SATA and DDR, peripheral interfaces such as USB and PCI, and the like. As signal frequencies approach and exceed one GHz, a physical phenomenon known as "skin effect" becomes a design concern. Skin effect is the tendency of an alternating electric current to become distributed within a conductor such that the current density is largest near the surface of the conductor, and decreases with greater depths in the conductor. The electric current flows mainly at the "skin" of the conductor, between the outer surface and a level called the skin depth. The skin effect causes the effective resistance of the conductor to increase at higher frequencies where the skin depth is smaller, thus reducing the effective cross-section of the conductor. The skin effect is due to opposing eddy currents induced by the changing magnetic field resulting from the alternating current. Skin effect is exhibited in all conductors, including wires and conductive traces that carry signals at a printed circuit board (PCB). In addition to $I^2R$ loss due to skin effect, other losses contribute to reduced signal integrity, including dielectric loss and radiation. Interference caused by coupling of noise from other signal conductors can further degrade signal integrity, resulting in lower data transfer performance. FIGS. 2-5 illustrate techniques for reducing losses due to skin effect while also reducing interference in conductors such as PCB traces and integrated circuit package traces.

Figure 2A:
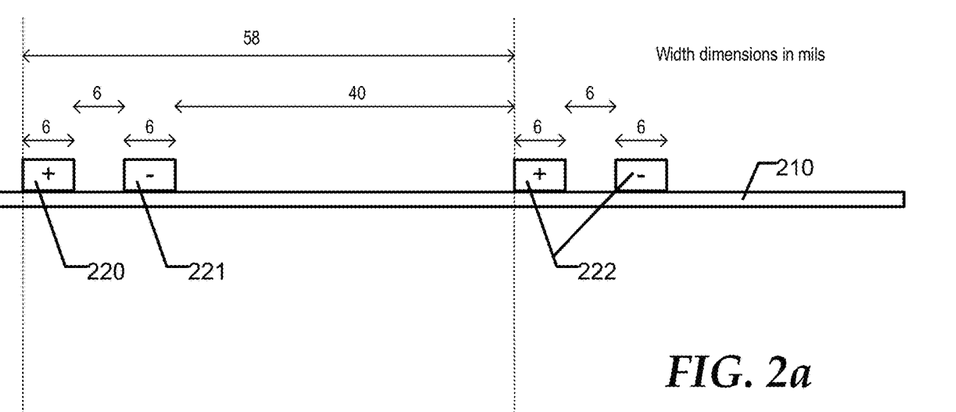
FIGS. 2a and 2b are block diagrams illustrating traces at a printed circuit board for conducting high frequency differential signals according to a specific embodiment of the present disclosure.
Figure 2B:
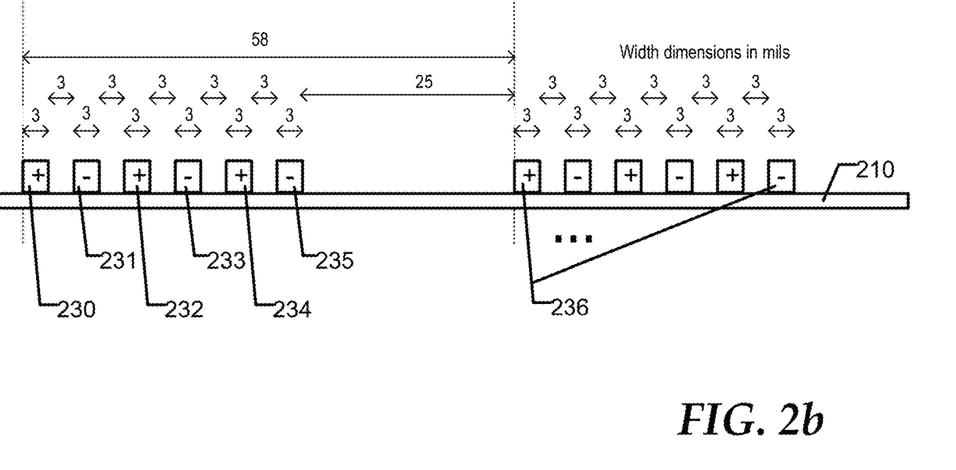

FIGS. 2a and 2b shows a printed circuit board 210 including traces for conducting high frequency differential signals according to a specific embodiment of the present disclosure. PCB 210 can represent any PCB included at information handling system 100 or a peripheral device associated with system 100. PCB 210 may also represent a dielectric and routing layer included at an integrated circuit package. Differential signaling is a method for electrically transmitting information using two complementary signals. The technique sends two complementary signals, referred to herein as a differential pair of signals. Differential signaling provides significantly better signal integrity than is possible with a single conductor.

FIG. 2a shows a side view of printed circuit board 210 including conductor traces 220 and 221 for carrying a first differential signal pair, and traces 222 associated with a second differential pair. FIG. 2a also shows dimensions and spacing of the PCB features, in units of mils. For example, each conductor trace is six mils in width, and each differential pair is separated by a space of six mils. The immediately adjacent traces 222 corresponding to a different signal are separated from trace 221 by an isolation region of forty mils. Accordingly, the total space required for a single differential pair is shown to be 58 mils. Trace 220 is configured to carry a first signal of a differential signal pair, identified by a "+" sign, and trace 221 is configured to carry a second signal of a differential signal pair, identified by a "−" sign. The isolation region is necessary to minimize signal interference between adjacent signal routing, such as coupling, crosstalk, and the like. The trace and spacing dimensions also contribute to a characteristic impedance of the differential signal path. For example, the characteristic impedance of the PCB signal path provided by traces 220 and 221 may be 85 ohms.

FIG. 2b shows a side view of printed circuit board 210 including conductor traces 230, 231, 232, 233, 234, 235, and immediately adjacent traces 236 according to a specific embodiment of the present disclosure. Traces 230, 232, and 234, denoted by the "+" sign are configured to carry a first signal of a differential signal pair, while traces 231, 233, and 235, denoted by the "−" sign are configured to carry a second, complementary, signal of the differential signal pair, sometimes referred to as a return current. Each of traces 230-236 are three mils in width, and separated by a space of three mils. The isolation width is 25 mils so that the total space required for a single differential pair is 58 mils, the same as illustrated in FIG. 2a. The configuration and dimensions of the traces shown at FIG. 2b also provide a characteristic impedance of approximately 85 ohms, the same as provided by the configuration of FIG. 2a. As described below, the configuration of FIG. 2b provides multiple advantages to the configuration of FIG. 2a, including lower I²R losses, reduced coupling and crosstalk due to reduced electromagnetic fringing, and potentially greater route density.

The particular dimensions illustrated at FIGS. 2a and 2b are provided merely for example and comparison, such as corresponding to current design rules when using relatively inexpensive PCB dielectric materials. Today, trace widths and spacing of three mils is possible for a typical PCB. Smaller feature sizes and spacing may be possible, perhaps requiring dielectric material having relatively lower loss properties. Furthermore, the dimensions of traces and spacing included within an integrated circuit package may be significantly smaller, such as 0.3 mils. In addition, the vertical dimensions shown at FIGS. 2a and 2b are exaggerated for clarity.

Figure 3A:
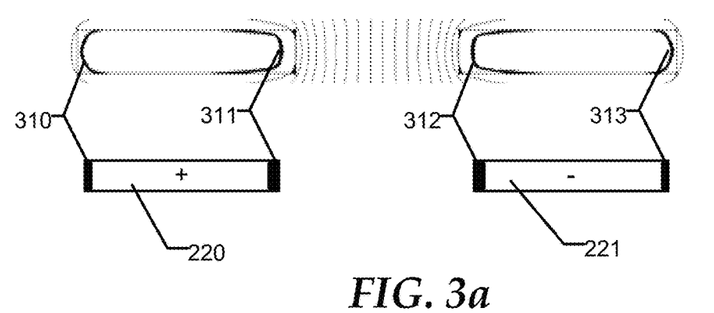
FIGS. 3a and 3b are block diagrams illustrating skin effect at conductor traces of a printed circuit board according to a specific embodiment of the present disclosure.

FIGS. 3a and 3b show how skin effect reduces the current-carrying capacity of a conductor trace according to a specific embodiment of the present disclosure. FIG. 3a shows conductor traces 220 and 221 of FIG. 2a with an added representation of magnetic field lines and skin depth induced in the traces by signal currents carried by the traces. In particular, the darkened areas identified by references 310, 311, 312, and 313 indicate where a majority of signal current is conducted. When only two relatively wide traces are used to couple a differential signal, the intensity of magnetic field lines extend relatively far to the left and right of the conductors, requiring a relatively greater isolation distance to a next signal trace. At low frequencies, substantially the full cross section of each conductor trace can conduct current. At high frequencies, currents prefer the sides of the conductor traces that results in lowest inductance, and a majority of the conductor trace is effectively wasted. FIG. 2a also illustrates that the edges of the trace conductors that are closest to their mutual return currents (between the two traces) exhibit greater current flow than at the outer edges (left and right sides).

Figure 3B:
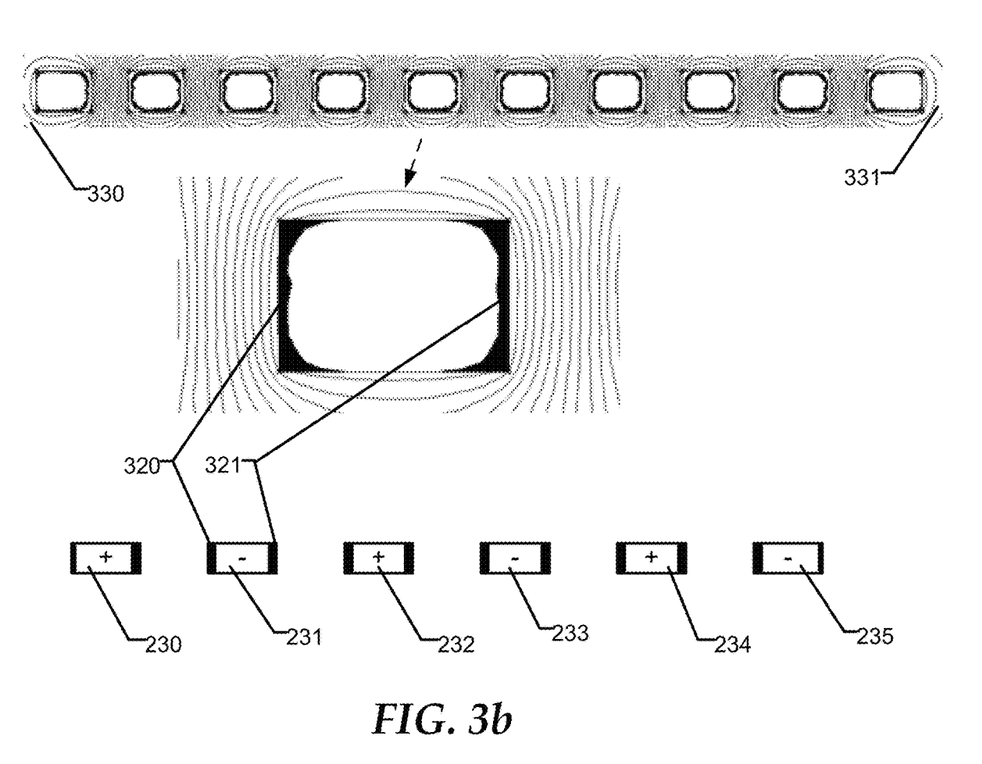

FIG. 3b shows conductor traces 230-235 of FIG. 2b with an added representation of magnetic field lines and skin depth induced in the traces by signal currents carried by the traces. In particular, the darkened areas identified by references 320 and 321 indicate where a majority of signal current is conducted. By utilizing additional, replicated, conductor traces arranged with alternating differential polarity, the total skin depth is increased relative to that of having only two traces shown at FIG. 3a. Furthermore, each of the replicated conductor traces is now carrying less current, as the total current is distributed across multiple conductors. Accordingly, relatively strong magnetic field lines around each of the narrower, replicated, conductors do not extend as far away from each trace. References 330 and 331 illustrate reduced electromagnetic fringing at the left and right side of the set of traces, thereby allowing an isolation space to adjacent unrelated signal traces to be reduced.

Figure 4A:
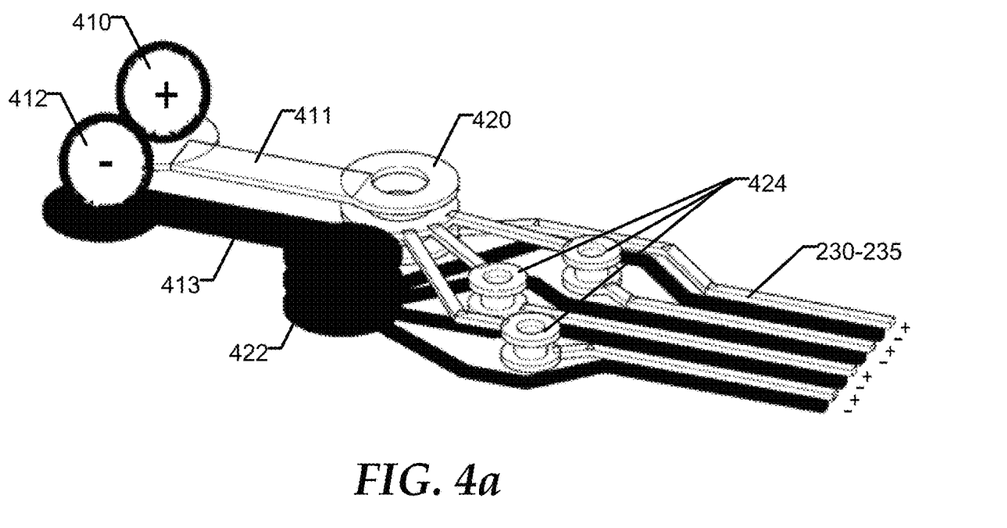
FIGS. 4a, 4b, 4c, and 4d are perspective views illustrating techniques for distributing two differential signal conductors to the replicated traces according to specific embodiments of the present disclosure.

FIGS. 4a, 4b, 4c, and 4d show techniques for distributing two differential signal conductors to the replicated traces shown at FIGS. 2b and 3b. Today, most integrated circuits, chipsets, hubs, and the like, that provide an interface using differential signaling, generates a single complementary signal pair. Therefore, some means to distribute the two signals to corresponding replicated conductor traces is required. In the future, this particular requirement may be eliminated by dedicating individual interface pins for each of the discreet replicated signals. FIG. 4a shows a perspective view of a PCB including ball grid array (BGA) terminals 410 and 412 that provide a differential signal interface from an integrated circuit package to a printed circuit board. Conductor trace 411 electrically couples a first complementary differential signal (indicated by a "+" sign) from BGA terminal 410 to a PCB via 420. Vias 424 further propagate the first signal to traces 230, 232, and 234 a lower layer of the PCB. Conductor trace 413 electrically couples a second complementary differential signal (indicated by a "−" sign) from BGA terminal 412 to a PCB via 422, which distributes the second signal to traces 231, 233, and 235 at the same layer of the PCB as traces 230, 232, and 234.

Figure 4B:
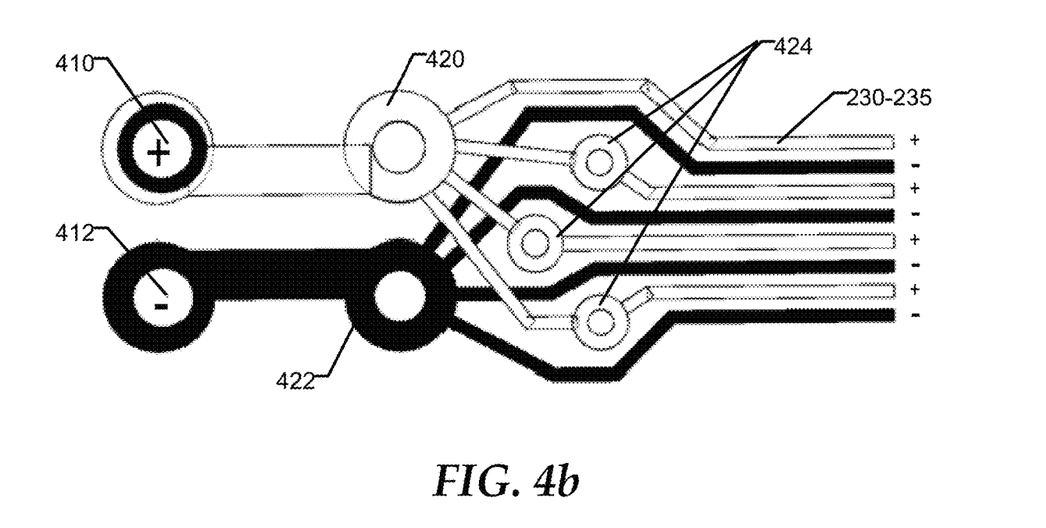
Figure 4C:
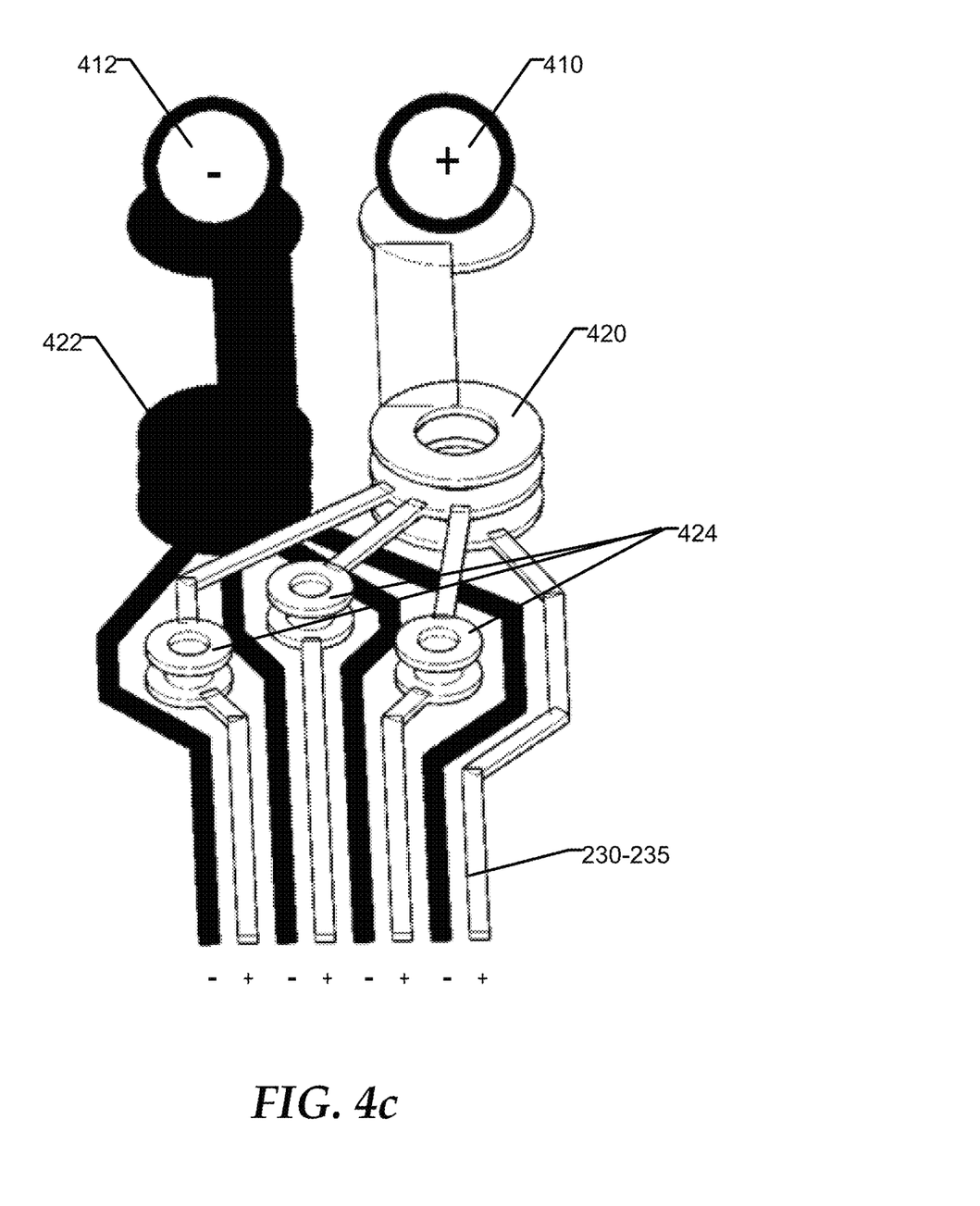
Figure 4D:
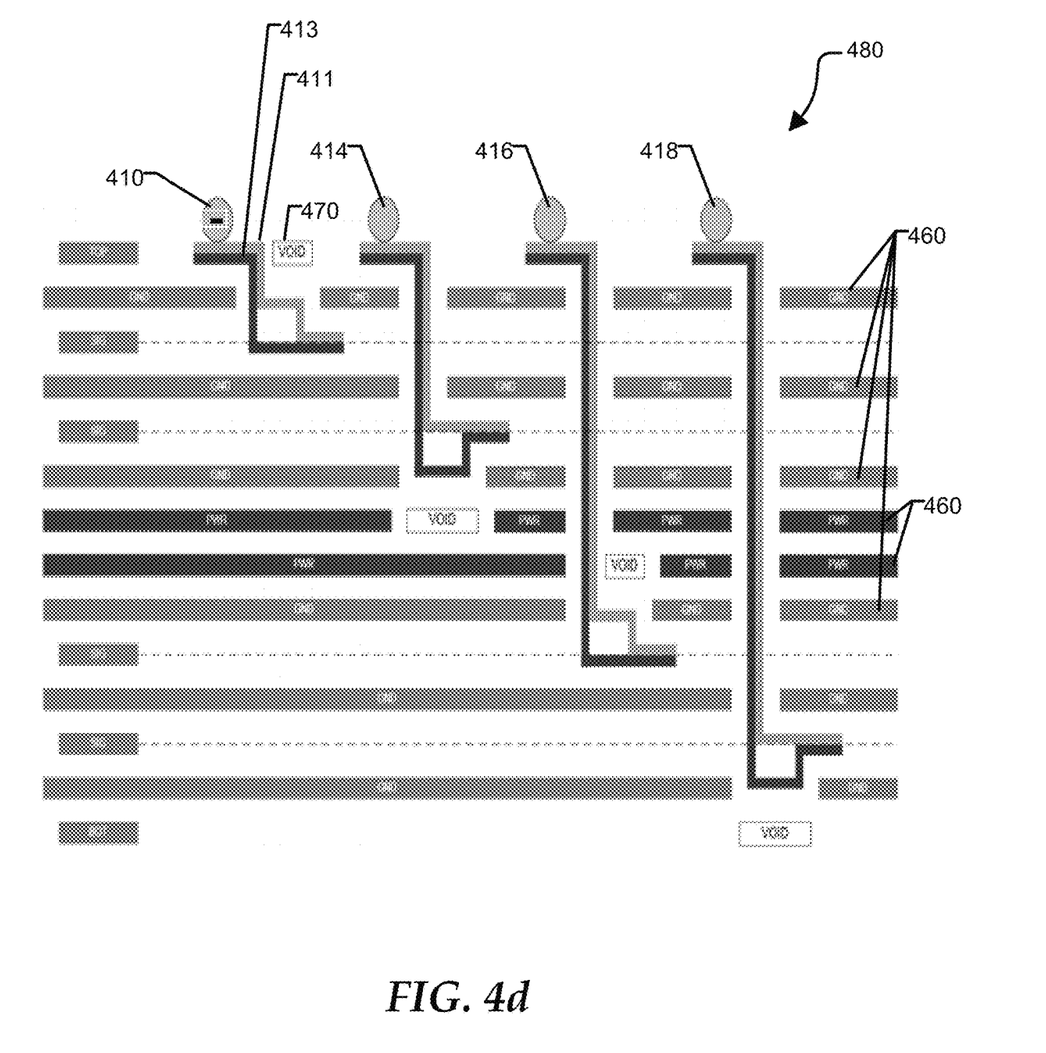

One or more of the vias 420, 422, and 424 can include micro-vias that do not penetrate all layers of the PCB, and therefore do not create radio-frequency stubs that typically need to be partially drilled-out. In an embodiment, FIGS. 4a-4d can represent an integrated circuit package, where BGA terminals 410 and 412 are, instead, C4 bumps provided at an integrated circuit die, and the conductor traces are utilized to convey differential signals from particular C4 bumps to package terminals, such as BGA terminals 410 and 412. FIG. 4b shows a top view of the same features as FIG. 4a, and FIG. 4c provides yet another perspective view to more clearly show the how the micro-vias provide transitioning from a single pair of differential signal conductors to the replicated signal conductors. FIG. 4d shows a cross-sectional view of a portion of a multi-layer printed circuit board 480, including BGA terminal 410 and conductor traces 411 and 413 of FIGS. 4a-4c. BGA terminal 412 of the previous views is located behind BGA terminal 410, and is not visible in this view. BGA terminals 414, 416, and 418 may correspond to other differential signal pairs. FIG. 4d also shows ground reference conductors layers 460, power layers 460, and voids 470 corresponding to openings to allow signals to transition between layers.

Figure 5:
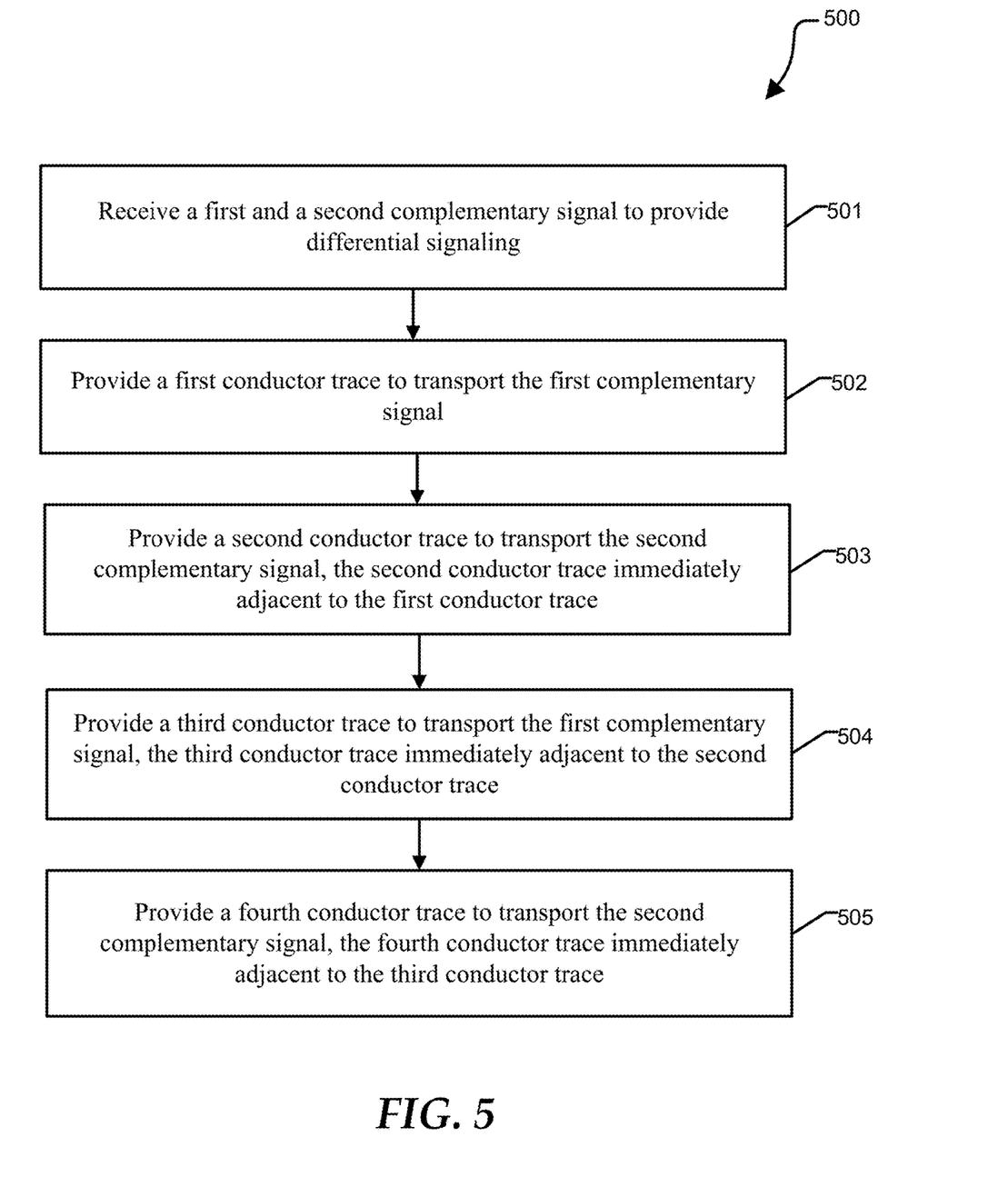
FIG. 5 shows a method for distributing two differential signal conductors to replicated traces according to a specific embodiment of the present disclosure.

FIG. 5 shows a method 500 for distributing two differential signal conductors to the replicated traces according to a specific embodiment of the present disclosure. Method 500 begins at block 501 where a first and a second complementary signal to provide differential signaling are received. For example, a circuit having a high-speed differential signaling interface, such as USB controller 110, can include a bus transceiver configured to generate and/or receive information using differential signaling. Method 500 continues at block 502 where a first conductor trace is provided to transport the first complementary signal. For example, conductor trace 230 of FIG. 2b can be electrically coupled to the first complementary signal. Method 500 continues at block 503 where a second conductor trace is provided to transport the second complementary signal, the second conductor trace immediately adjacent to the first conductor trace. For example, conductor trace 231 of FIG. 2b can be electrically coupled to the second complementary signal. Method 500 continues at block 504 where a third conductor trace is provided to transport the first complementary signal, the third conductor trace immediately adjacent to the second conductor trace. For example, conductor trace 232 of FIG. 2b can be electrically coupled to the first complementary signal. Method 500 completes at block 505 where a fourth conductor trace is provided to transport the second complementary signal, the fourth conductor trace immediately adjacent to the third conductor trace. For example, conductor trace 233 of FIG. 2b can be electrically coupled to the second complementary signal.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An apparatus comprising:
    replicated conductor traces arranged to electrically couple a first and a second complementary signal to provide differential signaling for a differential signal, the replicated traces including:
    a first trace to conduct the first complementary signal of the differential signal, the first trace being in a particular layer of the apparatus;
    a second trace immediately adjacent to the first trace to conduct the second complementary signal of the differential signal, the second trace being in the layer;
    a third trace immediately adjacent to the second trace to conduct the first complementary signal of the differential signal, the third trace being in the layer; and
    a fourth trace immediately adjacent to the third trace to conduct the second complementary signal of the differential signal, the fourth trace being in the layer.

2. The apparatus of claim 1, wherein the replicated traces are included at a primary printed circuit board of an information handling system.

3. The apparatus of claim 1, wherein the replicated traces are included at an integrated circuit package.

4. The apparatus of claim 1, wherein the replicated traces reduce power loss relative to power losses associated with use of a single pair of conductor traces to electrically couple the first and the second complementary signal, the power losses determined by a magnitude of skin depth at each conductor.

5. The apparatus of claim 1, wherein the replicated traces reduce electromagnetic fringing at the first and fourth trace relative to electromagnetic fringing associated with use of a single pair of conductor traces to electrically couple the first and the second complementary signal, the reduced electromagnetic fringing to reduce signal coupling to conductor traces unrelated to the first and second complementary signals.

6. The apparatus of claim 1, wherein the replicated traces provide a characteristic impedance that is substantially the same as the characteristic impedance of a single pair of conductor traces to electrically couple the first and the second complementary signals.

7. The apparatus of claim 1, wherein the replicated traces allows for a reduced isolation space to an unrelated signal trace adjacent to the replicated traces compared to an isolation space associated with a single pair of conductor traces.

8. A method comprising:
receiving a first and a second complementary signal of a differential signal to provide differential signaling;
providing a first conductor trace to transport the first complementary signal of the differential signal, the first conductor trace being in a particular layer of an apparatus;
providing a second conductor trace to transport the second complementary signal of the differential signal, the second conductor trace immediately adjacent to the first conductor trace, the second conductor trace being in the layer;
providing a third conductor trace to transport the first complementary signal of the differential signal, the third conductor trace immediately adjacent to the second conductor trace, the third conductor being entirely in the layer; and
providing a fourth conductor trace to transport the second complementary signal of the differential signal, the fourth conductor trace immediately adjacent to the third conductor trace, the fourth conductor trace being in the layer.

9. The method of claim 8, wherein the first, second, third, and fourth traces are included at a primary printed circuit board of an information handling system.

10. The method of claim 8, wherein the first, second, third, and fourth traces are included at an integrated circuit package.

11. The method of claim 8, wherein the first, second, third, and fourth traces are configured to reduce power loss relative to power losses associated with use of a single pair of conductor traces to electrically couple the first and the second complementary signal, the power losses determined by a magnitude of skin depth at each conductor.

12. The method of claim 8, wherein the first, second, third, and fourth traces are configured to reduce electromagnetic fringing at the first and fourth trace relative to electromagnetic fringing associated with use of a single pair of conductor traces to electrically couple the first and the second complementary signal, the reduced electromagnetic fringing to reduce signal coupling to conductor traces unrelated to the first and second complementary signals.

13. The method of claim 8, wherein the first, second, third, and fourth traces are configured to provide a characteristic impedance that is substantially the same as the characteristic impedance of a single pair of conductor traces to electrically couple the first and the second complementary signals.

14. The method of claim 8, wherein the first, second, third, and fourth traces are configured to provide a reduced isolation space to an unrelated signal trace adjacent to the first or fourth traces compared to an isolation space associated with a single pair of conductor traces.

15. A method comprising:
receiving a first complementary signal of a first differential signaling pair at a first terminal;
receiving a second complementary signal of the first differential signaling pair at a second terminal;
receiving the first complementary signal of the differential signaling pair at a third terminal;
receiving the second complementary signal of the first differential signaling pair at a fourth terminal;
providing a first conductor trace coupled to the first terminal to transport the first complementary signal of the differential signaling pair, the first conductor trace being in a particular layer of an apparatus;
providing a second conductor trace coupled to the second terminal to transport the second complementary signal of the differential signaling pair, the second conductor trace immediately adjacent to the first conductor trace, the second conductor trace being in the layer;
providing a third conductor trace coupled to the third terminal to transport the first complementary signal of the differential signaling pair, the third conductor trace immediately adjacent to the second conductor trace, the third conductor trace being in the layer; and
providing a fourth conductor trace coupled to the fourth terminal to transport the second complementary signal of the differential signaling pair, the fourth conductor trace immediately adjacent to the third conductor trace, the fourth conductor trace being in the layer.

16. The method of claim 15, wherein the first, second, third, and fourth traces are included at a primary printed circuit board of an information handling system.

17. The method of claim 15, wherein the first, second, third, and fourth traces are included at an integrated circuit package.

18. The method of claim 15, wherein the first, second, third, and fourth traces are configured to reduce power loss relative to power losses associated with use of a single pair of conductor traces to electrically couple the first and the second complementary signal, the power losses determined by a magnitude of skin depth at each conductor.

19. The method of claim 15, wherein the first, second, third, and fourth traces are configured to reduce electromagnetic fringing at the first and fourth trace relative to electromagnetic fringing associated with use of a single pair of conductor traces to electrically couple the first and the second complementary signal, the reduced electromagnetic fringing to reduce signal coupling to conductor traces unrelated to the first and second complementary signals.

20. The method of claim 15, wherein the first, second, third, and fourth traces are configured to provide a reduced isolation space to an unrelated signal trace adjacent to the first or fourth traces compared to an isolation space associated with a single pair of conductor traces.

* * * * *